US010365344B2

(12) United States Patent
Dannels et al.

(10) Patent No.: US 10,365,344 B2
(45) Date of Patent: *Jul. 30, 2019

(54) MAGNETIC RESONANCE IMAGING APPARATUS

(71) Applicant: TOSHIBA MEDICAL SYSTEMS CORPORATION, Otawara-shi (JP)

(72) Inventors: Wayne R. Dannels, Mentor, OH (US); Takashi Shigeta, Tochigi (JP)

(73) Assignee: TOSHIBA MEDICAL SYSTEMS CORPORATION, Otawara-shi, Tochigi-Ken (JP)

(*) Notice: Subject to any disclaimer, the term of this patent is extended or adjusted under 35 U.S.C. 154(b) by 231 days.

This patent is subject to a terminal disclaimer.

(21) Appl. No.: 14/963,973

(22) Filed: Dec. 9, 2015

(65) Prior Publication Data

US 2016/0097831 A1 Apr. 7, 2016

Related U.S. Application Data

(63) Continuation of application No. PCT/JP2014/065385, filed on Jun. 10, 2014, which is
(Continued)

(51) Int. Cl.
*G01R 33/565* (2006.01)
*G01R 33/561* (2006.01)
(Continued)

(52) U.S. Cl.
CPC ....... *G01R 33/56554* (2013.01); *G01R 33/34* (2013.01); *G01R 33/385* (2013.01);
(Continued)

(58) Field of Classification Search
USPC ........ 324/309, 316, 318, 314, 322; 600/410, 600/422
See application file for complete search history.

(56) References Cited

U.S. PATENT DOCUMENTS

| 6,486,671 B1 | 11/2002 | King |
| 6,559,642 B2 | 5/2003 | King |

(Continued)

FOREIGN PATENT DOCUMENTS

| JP | 7-59750 A | 3/1995 |
| JP | 2002-315731 | 10/2002 |

(Continued)

OTHER PUBLICATIONS

International Search Report for PCT/JP2014/065385, dated Aug. 19, 2014, 6 pages.
(Continued)

*Primary Examiner* — Vincent Q Nguyen
(74) *Attorney, Agent, or Firm* — Nixon & Vanderhye P.C.

(57) ABSTRACT

An MRI system according to an embodiment includes an MRI sequence controller and an MRI system controller. Serving as a prescan unit, the MRI sequence controller performs a prescan for acquiring a sensitivity distribution of a coil. Serving as a main scan unit, the MRI sequence controller performs a main scan for acquiring signals of a magnetic resonance image. Serving as a corrector, the MRI system controller corrects the sensitivity distribution in accordance with a distortion that is contained in the magnetic resonance image and that results from the performing of the main scan. Serving as a generator, the MRI system controller generates an output magnetic resonance image using the corrected sensitivity distribution.

8 Claims, 11 Drawing Sheets

Related U.S. Application Data a continuation-in-part of application No. 13/914,160, filed on Jun. 10, 2013.

(51) Int. Cl.
  *G01R 33/34* (2006.01)
  *G01R 33/385* (2006.01)
  *G01R 33/54* (2006.01)

(52) U.S. Cl.
  CPC ........ *G01R 33/543* (2013.01); *G01R 33/5611* (2013.01); *G01R 33/5616* (2013.01)

(56) References Cited

U.S. PATENT DOCUMENTS

| | | |
|---|---|---|
| 6,836,116 B2 | 12/2004 | King et al. |
| 6,949,928 B2 | 9/2005 | Gonzalez Ballester et al. |
| 8,918,159 B2 | 12/2014 | Riederer |
| 2004/0070394 A1 | 4/2004 | Gonzalez Ballester et al. |
| 2004/0135579 A1 | 7/2004 | Takizawa et al. |
| 2004/0189299 A1 | 9/2004 | Ikezaki |
| 2006/0100503 A1* | 5/2006 | Takai .............. A61B 5/055 600/422 |
| 2007/0052417 A1* | 3/2007 | Zhang ............ G01R 33/56341 324/309 |
| 2009/0115413 A1* | 5/2009 | Senegas ............ G01R 33/5611 324/309 |
| 2009/0169084 A1 | 7/2009 | Li et al. |
| 2009/0285463 A1 | 11/2009 | Otazo |
| 2011/0216955 A1 | 9/2011 | Takai |
| 2012/0074940 A1* | 3/2012 | Kimura ............. A61B 5/055 324/314 |
| 2013/0082702 A1* | 4/2013 | Blumhagen ...... G01R 33/56563 324/309 |
| 2013/0187651 A1* | 7/2013 | Konta ............. G01R 33/5611 324/309 |
| 2013/0281831 A1 | 10/2013 | Riederer |
| 2014/0361770 A1 | 12/2014 | Dannels |

FOREIGN PATENT DOCUMENTS

| | | |
|---|---|---|
| JP | 2004-275198 | 10/2004 |
| JP | 2009-142522 | 7/2009 |
| JP | 2009-160408 | 7/2009 |
| JP | 2011-200637 | 10/2011 |
| WO | WO 02/056767 | 7/2002 |

OTHER PUBLICATIONS

Written Opinion for PCT/JP2014/065385, dated Aug. 19, 2014, 3 pages.

Pruessmann, et at, "SENSE: Sensitivity Encoding for Fast MRI," *Magnetic Resonance in Medicine*, vol. 42, pp. 952-962 (1999).

Chen, et aL, "Removal of EPI Nyquist Ghost Artifacts With Two-Dimensional Phase Correction," *Magnetic Resonance in Medicine*, vol. 51, pp. 1247-1253 (2004).

Xu, et al., "Robust 2D Phase Correction for Echo Planar Imaging Under a Tight Field-of-View," *Magnetic Resonance in Medicine*, vol. 64, pp. 1800-1813 (2010).

Office Action dated Jan. 25, 2018 in U.S. Appl. No. 13/914,160.

Office Action dated Aug. 27, 2018 in U.S. Appl. No. 13/914,160.

Office Action dated Jun. 30, 2016 in CN Application No. 201480001863.9.

Machine translation of JP 2009-142522.

Japanese office action dated Nov. 6, 2018, in Patent Application No. JP 2014-119987.

* cited by examiner

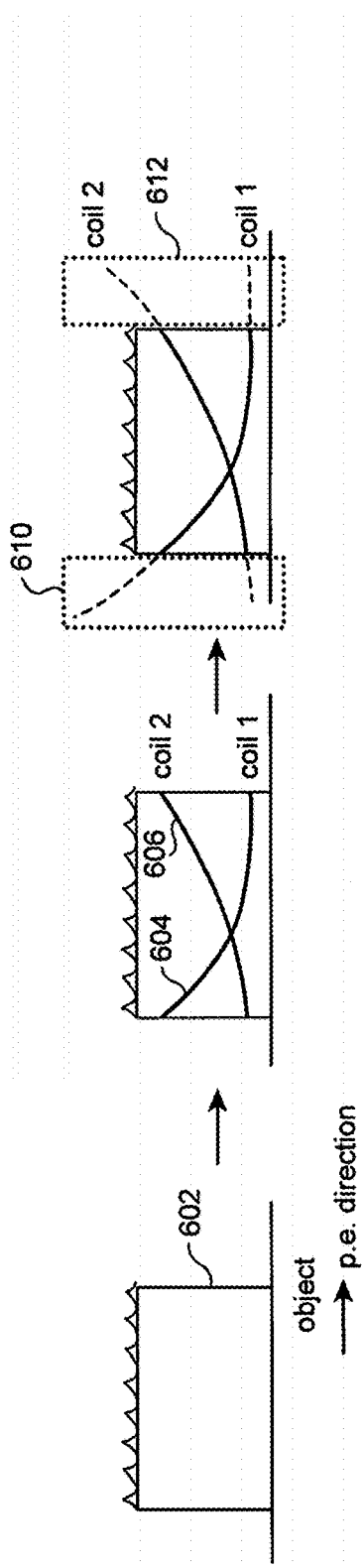
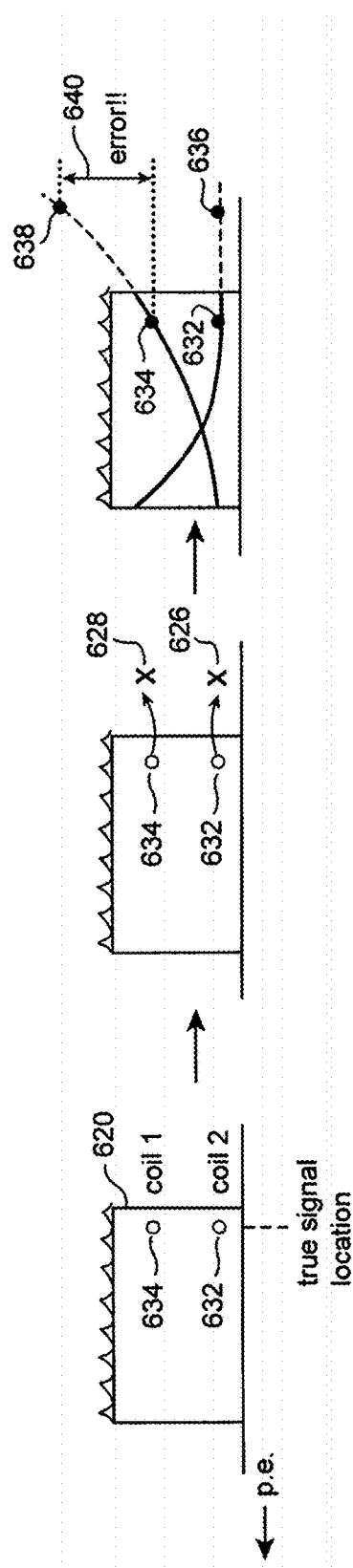
Figure 6A (Prior Art)
Figure 6B

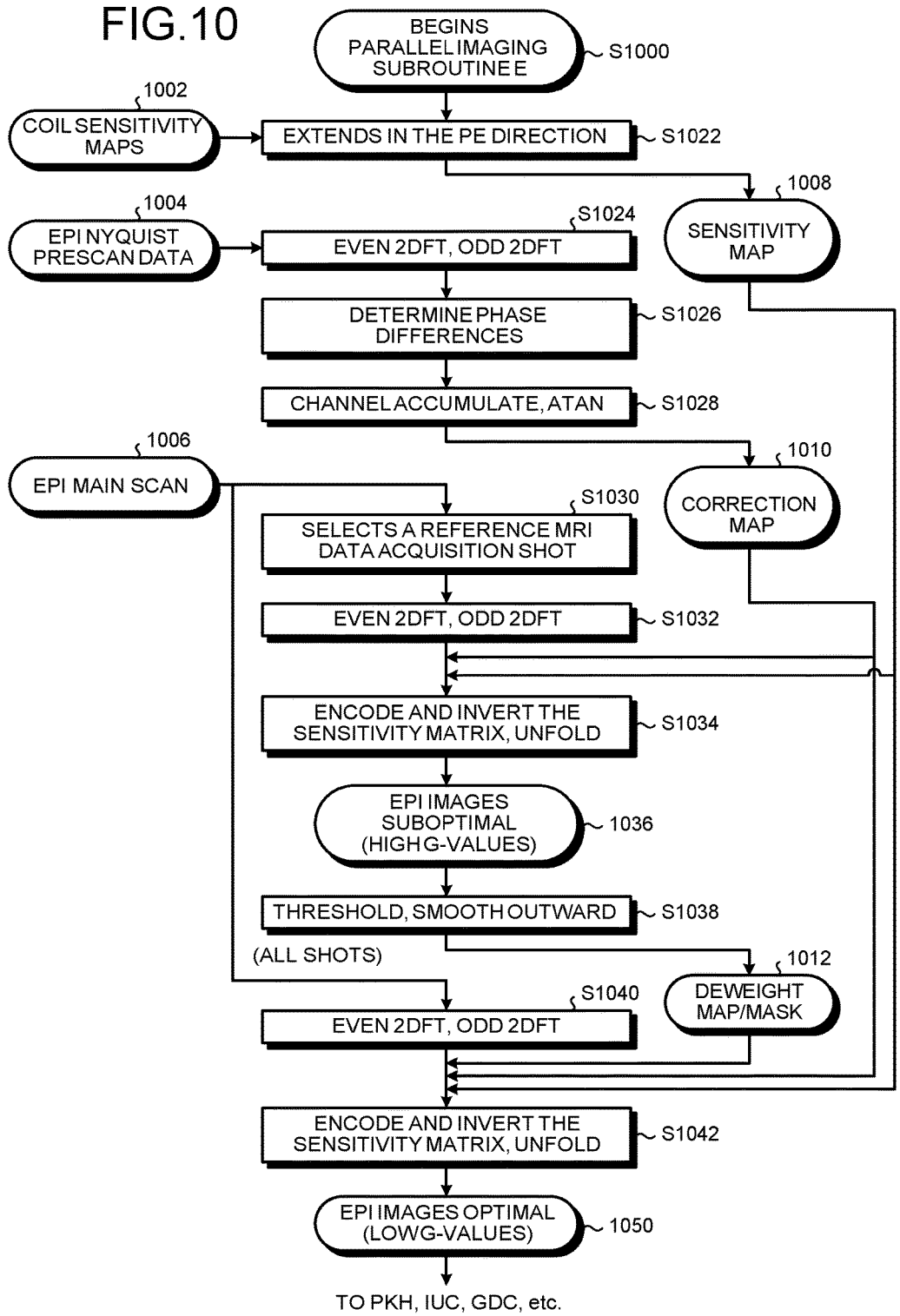

MAGNETIC RESONANCE IMAGING APPARATUS

CROSS-REFERENCE TO RELATED APPLICATIONS

This application is a continuation of International Application No. PCT/JP2014/065385, filed on Jun. 10, 2014 which is a continuation-in-part of the prior U.S. patent application Ser. No. 13/914,160, filed on Jun. 10, 2013, the entire contents of which are incorporated herein by reference.

FIELD

Embodiments described herein relate generally to a magnetic resonance imaging apparatus.

BACKGROUND

Magnetic resonance imaging is an imaging method in which nuclear spins of an object that is positioned in a static magnetic field are magnetically excited with RF (Radio Frequency) pulses of the Larmor frequency and images are generated from the data of magnetic resonance signals that are generated in accordance with the excitation. Various techniques for fast imaging and for improving the image quality have been proposed.

BRIEF DESCRIPTION OF THE DRAWINGS

FIG. 6A illustrates example conventional techniques for extending sensitivity maps.

FIG. 6B illustrates example errors that can be caused by extending sensitivity maps according to conventional methods.

FIG. 10 illustrates a flow chart of a method to use improved sensitivity maps and improved masks, in accordance with one or more embodiments, in combination with 2D phase correction in EPI.

DETAILED DESCRIPTION

A magnetic resonance imaging apparatus according to an embodiment includes a prescan unit, a main scan unit, a corrector, and a generator. The prescan unit performs a prescan for acquiring a sensitivity distribution of a coil. The main scan unit performs a main scan for acquiring a signal of a magnetic resonance image. The corrector corrects the sensitivity distribution in accordance with a distortion that is contained in the magnetic resonance image and that results from the performing of the main scan. The generator generates an output magnetic resonance image, using the corrected sensitivity distribution.

A magnetic resonance imaging apparatus (hereinafter, MRI (Magnetic Resonance Imaging) system as appropriate) will be described below with reference to the drawings.

EMBODIMENTS

Figure 1:
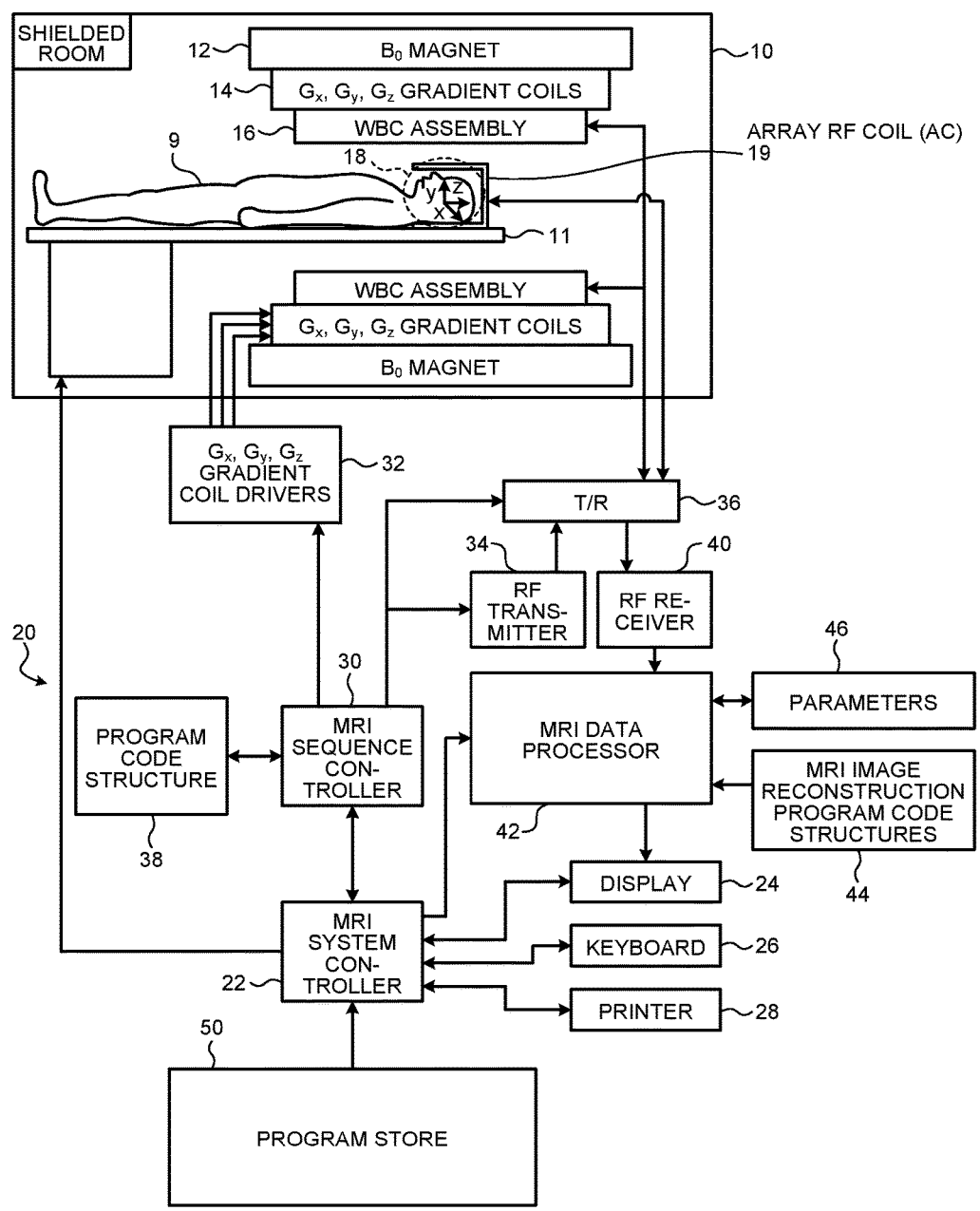
FIG. 1 is a high-level schematic block diagram of an MRI system adapted to reduce unfolding artifacts caused by spatially misregistered signals, in accordance with one or more embodiments.

FIG. 1 is a high-level schematic block diagram of an MRI system adapted to reduce unfolding artifacts caused by spatially misregistered signals, in accordance with one or more embodiments. The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field BO magnet 12, a Gx, Gy and Gz gradient coil set 14 and a large whole body RF coil (WBC) assembly 16. Along the horizontal axis of this cylindrical array of elements is an imaging volume 18 shown as substantially encompassing the head of a patient 9 supported by a patient table 11. A smaller array RF coil (AC) 19 might be more closely coupled to the patient head (referred to herein, for example, as "scanned object" or "object") in imaging volume 18. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils (PAC). These may include at least one coil configured to transmit RF signals into the imaging volume and a plurality of receiver coils configured to receive RF signals from an object, such as the patient head in the example above, in the imaging volume.

An MRI system controller 22 has input/output ports connected to a display 24, keyboard 26 and printer 28. As will be appreciated, the display 24 may be of the touch-screen variety so that it provides control inputs as well.

The MRI system controller 22 interfaces with MRI sequence controller 30 which, in turn, controls the Gx, Gy and Gz gradient coil drivers 32, as well as the RF transmitter 34 and the transmit/receive switch (T/R) 36 (if the same RF coil is used for both transmission and reception). The MRI sequence controller 30 includes suitable program code structure 38 for implementing MRI imaging (also known as nuclear magnetic resonance, or NMR, imaging) techniques including parallel imaging. For parallel imaging, MRI sequence controller 30 may facilitate a preparation scan (prescan) sequence which is used to determine sensitivity maps for RF coils 16 and/or 19, and a scan sequence to obtain a diagnostic image.

The MRI system includes an RF receiver 40 providing input to an MRI data processor 42 so as to create processed image data, which is sent to the display 24. The MRI data processor 42 is also configured for access to previously generated coil sensitivity maps (hereinafter, also referred to as sensitivity distributions), extended coil sensitivity maps, masks data and/or system configuration parameters 46 and MRI image reconstruction program code structures 44 and a program store 50.

Also illustrated in FIG. 1 is a generalized depiction of the program store 50 of the MRI system where stored program code structures (e.g., for image reconstruction with reduced unfolding artifacts, for defining graphical user interfaces and accepting operator inputs to same, etc.) are stored in non-transitory computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments described below. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes a coil sensitivity map generation process, an array of computer-readable accessible data value storage sites in physical storage media will be transformed from some prior state (e.g., all uniform "zero" values or all one values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure—as does a particular structure of computer control program codes that, when sequentially loaded into instruction registers and executed by one or more CPUs of the MRI system 20, causes a particular sequence of operational states to occur and be transitioned through within the MRI system.

The exemplary embodiments described below provide improved ways to generate and display MR images.

First, an overview of the MRI system according to the following exemplary embodiment will be described below.

The MRI system according to the embodiment includes an MRI sequence controller 30 and an MRI system controller 22. Serving as a prescan unit, the MRI sequence controller 30 performs a prescan for acquiring a sensitivity distribution of a coil. Serving as a main scan unit, the MRI sequence controller 30 performs a main scan for acquiring signals of a magnetic resonance image. Serving as a corrector, the MRI system controller 22 corrects the sensitivity distribution in accordance with a distortion that is contained in the magnetic resonance image and that results from the performing of the main scan. Serving as a generator, the MRI system controller 22 generates an output magnetic resonance image (output image) using the corrected sensitivity distribution.

MRI images are formed by acquiring RF response values (e.g. echo data) for points in k-space. The RF response values are generated by traversing k-space in two or three dimensions according to a configured pulse sequence. The acquisition of echo data in the frequency-encoding direction (e.g., along the x-axis) is typically rapid and on the order of several milliseconds. However, along the phase-encoding direction (e.g., y-axis), a different value of the applied phase-encoding gradient is used to sample each point. Therefore, typically, the acquisition time for an MRI image is largely determined by the number of phase-encoding steps.

Parallel imaging enables the shortening of acquisition time, by undersampling (performing decimation on) k-space along the phase-encoding direction. In many parallel imaging techniques, the number of sampled k-space points along the phase-encoding direction is reduced, thereby significantly shortening the acquisition time. Instead of sampling each point along the phase-encoding direction, parallel imaging techniques enable the use of spatial information inherent in the RF coils (e.g., phased array coils) to reconstruct the MRI image using the samples of fewer selected points along the phase-encoding direction. The reconstructed images based upon parallel imaging may also yield improved spatial resolution. Pruessmann K. P., et al., "SENSE: Sensitivity Encoding for Fast MRI," Magn. Reson. Med., 42:952-962, 1999, ("Pruessmann") the contents of which is hereby incorporated by reference in its entirety, describes a parallel imaging and reconstruction technique. Another example parallel imaging and reconstruction technique is SPEEDER™ which is available in MRI systems from Toshiba Inc. However, parallel imaging may result in reconstruction artifacts in the output diagnostic images.

Reconstruction artifacts are primarily due to the unfolding process that is required to obtain the desired diagnostic images based upon the intermediate images which are acquired by undersampling (in effect reducing the field of view) in the phase-encoding direction. "Unfolding" is the process of combining multiple aliased images in order to generate a desired diagnostic image. Often, the multiple aliased images vary from each other, in that each was collected from different RF receive coils. When two or more aliased images are unfolded, various artifacts may occur. Such artifacts resulting from the unfolding process are referred to herein as "unfolding artifacts."

Unfolding artifacts, particularly when combining spatially misregistered signals, can pose significant challenges to the accurate interpretation of diagnostic images. Spatial misregistration can occur in any type of MRI, but may be particularly significant in some techniques such as echo planar imaging (EPI). EPI applications, especially at high fields, benefit from being able to take a complete 2D (2-dimensional) image in a single shot. Acquiring a complete image in a single shot is highly desired for applications such as, for example, diffusion (e.g., diffusion weighted imaging—DWI), functional MRI (FMRI), and perfusion (dynamic susceptibility contrast (DSC) enhancement or arterial spin labeling (ASL)). However, EPI suffers from major distortions associated with, for example, susceptibility, chemical shift, imperfect shimming, and eddy currents. Conventional acquisition encoding and reconstruction can cause the spatial misregistration of these distortions. Specifically, when k-space is traversed in a fast zig-zag pattern, the y-direction (e.g., the phase-encoding direction) is traversed more slowly that the x-direction (e.g., the frequency-encoding direction). In effect, this results in the second gradient (e.g., in the phase-encoding direction) at times being much weaker relative to the first gradient, therefore resulting in more significant distortion along the phase-encoding direction.

Many parallel imaging techniques, including those referred to above, use two distinct image acquisitions to reconstruct the final diagnostic image. In addition to the main scan, which yields what is referred to here as an "intermediate diagnostic image," a coil calibration prescan image also contributes to the final diagnostic image. The main scans are pixel aliased as a result of the reduced unaliased field of view. In some main scans, such as, for example, in EPI main scans, the MR signal may be misregistered (or displaced) before antialiasing compared to the corresponding coil calibration scan image (or corresponding coil sensitivity maps). If this discrepancy is not resolved, unfolding artifacts may be visible in the final diagnostic image. The most serious of these artifacts appear as areas of discrete aliases shifted in the phase encode direction. However, these artifacts can also appear as reduced signal at the particular locations or increased noise (decreased SNR), or a combination of some or all of these aspects.

Figure 2A:
FIG. 2A illustrates an example MRI diagnostic image showing spatial distortions, generated using echo planar imaging (EPI) in a conventional MRI system without parallel imaging.

FIG. 2A illustrates an EPI image acquired without parallel imaging and showing a severe misregistration. For example, in the MRI image, the right eye appears stretched in an anterior (upward) direction relative to the head. In FIG. 2A, the phase encoding is in the front-back direction of the head (e.g., y-direction), and is shown as top-down or vertical direction in the image.

Figure 2B:
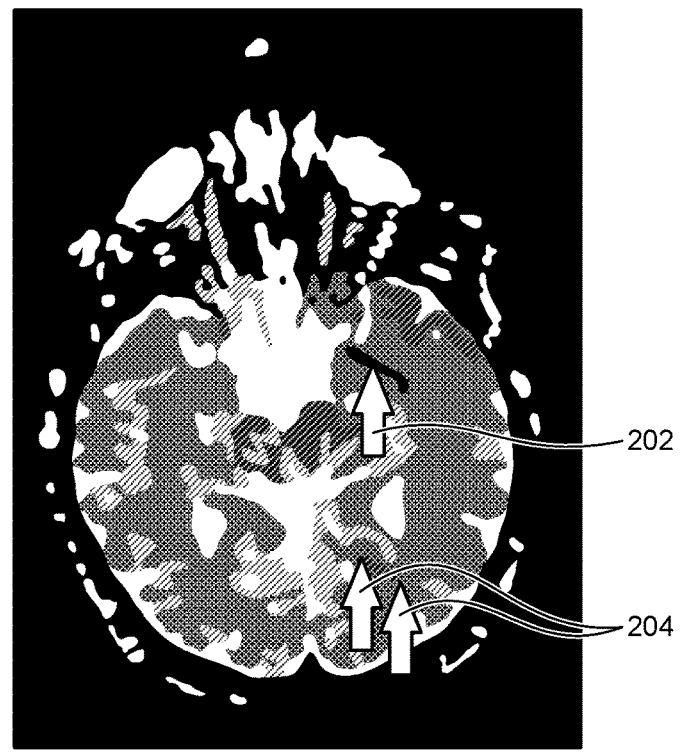
FIG. 2B illustrates an example of unfolding artifacts seen when a distorted EPI image is resolved in a conventional parallel imaging MRI system.

FIG. 2B illustrates an example of unfolding artifacts seen when a distorted EPI image is resolved in a conventional parallel imaging MRI system. FIG. 2B illustrates an EPI image of a head, as in FIG. 2A, but acquired using parallel imaging. The distortions in EPI are such that masking from sensitivity maps, as conventionally done, may not agree with the location of the EPI signal in many instances. For example, when there is an area with significant signal (such as the signal of the right eye in FIG. 2A) that in the distorted EPI image extends outside a conventional mask, then the parallel imaging matrix inversion may place that signal in the wrong location. Artifacts 202 and 204 shown in FIG. 2B are examples of the misplacements of distorted significant signals. Artifact 202, for example, belongs at the top of the eye, roughly at the same location as the extreme distortion in FIG. 2A. But, as shown here, parallel imaging may reduce the gross distortion greatly, roughly by the same factor as the acceleration factor (about a factor of 3 in these images) of the image acquisition. It should also be noted that the wrongly unfolded signal may appear positive or negative, due to background phase differences. From a diagnostic point of view, artifact 202 in particular, which appears to be a relatively strong signal relative to other signals in the image may present significant challenges to correct interpretation of the image.

There are two aspects of the parallel imaging techniques which cause this erroneous reconstruction and aliasing. In the first aspect, the distortion in the main scan lies outside a mask which is conventionally formed from the coil sensitivity maps. Because it lies outside the mask, in the reconstructed image the distorted signal is forced elsewhere, such as, into another aliased pixel location.

The second aspect that causes erroneous reconstruction is that the sensitivity values (determined from the corresponding coil sensitivity maps) used for the distorted signal are wrong. Regarding the sensitivity values, for example, wrong values in the corresponding coil sensitivity maps can cause incorrect encoding values to be used in the unfolding. The errors in the coil sensitivity maps may be caused by extrapolating the measured coil sensitivities. These errors can also occur if the main scan distortion is far from the main signal and, in the presence of rapidly varying coil sensitivity maps, a local coil sensitivity value which has significant error is selected. When the presumed encoding is erroneous, then the subsequent unfolding step will also be erroneous, and correspondingly the final unfolded image will contain error and artifact.

The techniques disclosed herein provide for significantly reducing, or even eliminating, unfolding artifacts caused by spatially misregistered signals acquired in parallel MRI. The technique for reducing unfolding artifacts disclosed herein includes a technique for processing coil sensitivity maps and a technique for processing the mask used in unfolding. Although when used in combination the improved technique for processing coil sensitivity maps and the improved technique for processing masks yield superior results, in some embodiments only one of these techniques may be used for generating an improved diagnostic image.

The technique disclosed here for processing prescan coil sensitivity maps provides enhanced sensitivity maps by finding a perimeter of the object being scanned, and then extending the sensitivity maps by replicating sensitivity data outwardly—especially in the direction of most likely misregistration. The extension by replication in the direction of the most likely misregistration yields sensitivity maps that more accurately reflect actual coil sensitivities at aliased points in k-space when compared to conventional coil sensitivity map generation (which were typically based upon extrapolation of measured sensitivity data using a fitted polynomial corresponding to each RF coil in an array of RF coils).

The technique disclosed here for processing one or more masks, includes generating the one or more masks from a preliminary unfolding of the main scan. The preliminary unfolding is, for example, a process for generating an intermediate diagnostic image to generate the mask. The mask thus created from a preliminary unfolding of a main scan image, when compared to the conventional masks created based upon coil sensitivity maps, better represents areas of significant signal (e.g., with substantially improved accuracy). Since the mask from the preliminary unfolding has geometric distortions identical to those of the main scan, its use will not incorrectly mask away areas where signal in the main scan is significant, and it will not force signal to be wrongly placed into other aliased pixels.

Thus, when either one or both of the above techniques are used in combination with, e.g., some conventional aspects from Pruessmann or SPEEDER™ (discussed above) to generate diagnostic images, improved images with reduced unfolding artifacts can be obtained.

Use of the herein disclosed new techniques enable reduction or substantial elimination of unfolding artifacts without substantial increases (e.g., times 2) in acquisition times required by conventional distortion correction techniques such as PLACE (a phase-based correction technique) and so-called blip-up-blip-down techniques. Moreover, artifacts are corrected without introducing fluctuations in a new series of images, such as would possibly confound FMRI, DSC or ASL processing. Further, disclosed embodiments can still use conventional prescan techniques, including those used for non-EPI parallel imaging scans. Additionally, the herein disclosed techniques should not require conditionals associated with building matrices of different sizes or selecting different subsets of pixels for inclusion/exclusion, thereby providing a model highly suited for parallel programming and computation speedup.

Figure 3:
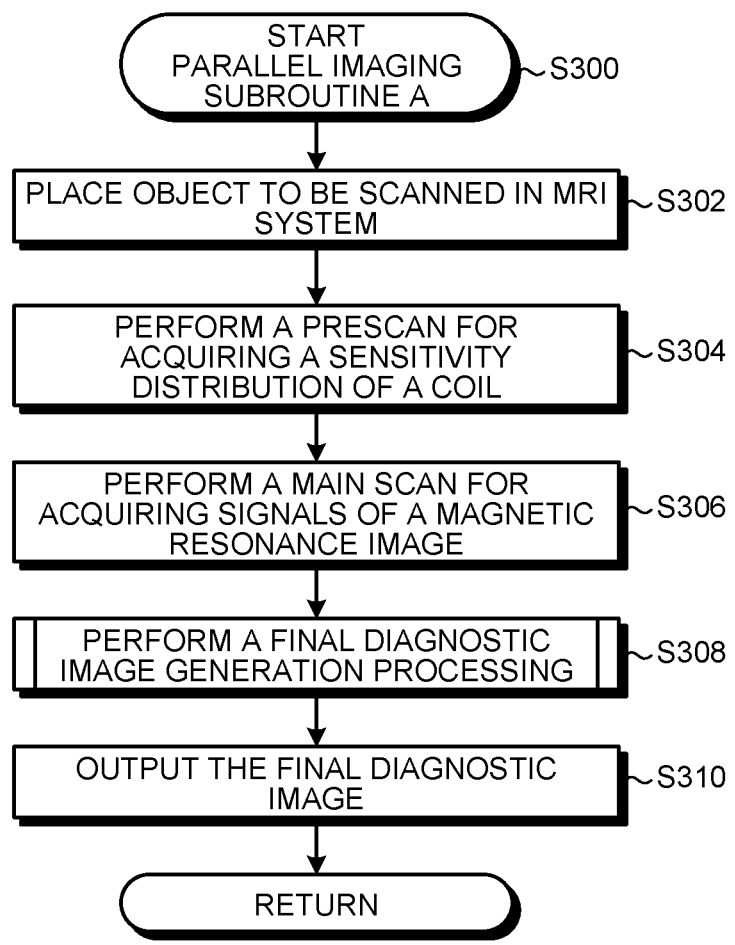
FIG. 3 illustrates a flow chart of a method for generating images with reduced unfolding artifacts from spatially misregistered signals, in accordance with one or more embodiments.

FIG. 3 illustrates a flow chart of a method for generating images with reduced unfolding artifacts from spatially misregistered signals, in accordance with one or more embodiments. In the illustrated embodiment, Parallel imaging subroutine A includes steps S302 to S310. In some embodiments, however, one or more of the steps S302 to S310 may not be performed, or may be performed in an order other than that shown.

The MRI system starts Parallel imaging subroutine A (step S300). The object to be scanned is placed in the MRI system (step S302). This step includes, in addition to placing the object in the MRI gantry in a manner suitable for scanning, configuring the MRI system for executing the scanning sequences appropriate for acquiring the desired type of diagnostic images. Configurations may include selection of prescan and main scan sequences, reduction factor associated with parallel imaging, gradient configurations, and the like.

Serving as the prescan unit, the MRI sequence controller 30 performs a prescan for acquiring a sensitivity distribution of a coil (step S304). Coil sensitivity maps are generated for the plurality of RF coils by performing a prescan of the object in the MRI gantry. The prescan can be executed in a configurable time period, typically on the order of a few seconds and substantially shorter in duration than a main scan. The prescan yields low resolution images for the entire imaging volume (in this case, with the object placed inside) in the scanner. U.S. Pat. No. 6,559,642 ("'642 patent"), which is hereby incorporated by reference in its entirety, describes one or more prescan techniques. Any one of several prescan techniques, including the fast, 2D gradient-recalled echo pulse sequence described in the '642 patent may be used in an embodiment. In some embodiments, a 2D or 3D Fourier Transform field echo scan may be performed (e.g., possibly taking about 20 seconds).

The prescan can also include generation of coil sensitivity maps (these are also referred to as "spatial sensitivity maps" or "spatial sensitivity distributions") from data acquired in the prescan. In an embodiment, a technique selected from those described in Pruessmann or the '642 patent may be used to determine the coil sensitivity map. The '642 patent, for example, describes one or more techniques for determining coil sensitivities of each coil that may be used to create the sensitivity map for the coil array. For each coil, on a pixel-by-pixel basis, the '642 patent calculates the ratio of the prescan image intensity of a coil and the sum of all the coils' prescan image intensities. The techniques described in the '642 patent do not require calibration images of the WBC. However, other techniques may divide each prescan image with a body coil image to determine the spatial sensitivities of respective coils. These techniques remove noise (e.g., patient contribution to the measured signal) from the prescan images yielding the coil sensitivity maps, to define the spatial sensitivity map for each RF coil in the phased array coil. In one or more embodiments, the coil sensitivity maps may be stored for use in connection with one or more subsequent main scans.

Serving as the main scan unit, the MRI sequence controller 30 performs a main scan for acquiring signals of a magnetic resonance image (step S306). A main scan of the object that is located in the MRI gantry is performed. The type of main scan and the sequence of images to be acquired may be configurable. In an embodiment, for example, an EPI main scan is performed. In parallel imaging techniques, all the coils in the phased array coil receive signals in parallel, and the spatial sensitivity maps of the respective coils are needed in order to recover the unaliased images from aliased images of the respective coils. The data received from this main scan (main scan data) is referred to herein as one or more intermediate diagnostic images.

The MRI system controller 22 performs a final diagnostic image generation processing (step S308). The main scan data (e.g., the intermediate diagnostic image) is processed in accordance with one or more of coil sensitivity maps extended in accordance with an embodiment and/or of a mask in accordance with an embodiment to generate a final diagnostic image. The processing includes unfolding the intermediate diagnostic image using the coil sensitivity maps and/or a mask improved in accordance with embodiments herein described. The final diagnostic image has substantially reduced unfolding artifacts, as compared to conventional parallel imaging scans. In some embodiments, more than one final diagnostic image may be generated. Any one of Parallel imaging subroutine B to E, which will be described below, is performed as the final diagnostic image generation processing at step S308.

The final diagnostic image (output image) is output (step S310). The output may include displaying on a display of the MRI system, or an external display. In some embodiments, the output may include transmitting the one or more diagnostic images over a network interface which may be part of the MRI system, or storing in a memory or other storage device that is either in or otherwise communicatively coupled to the MRI system.

Figure 4:
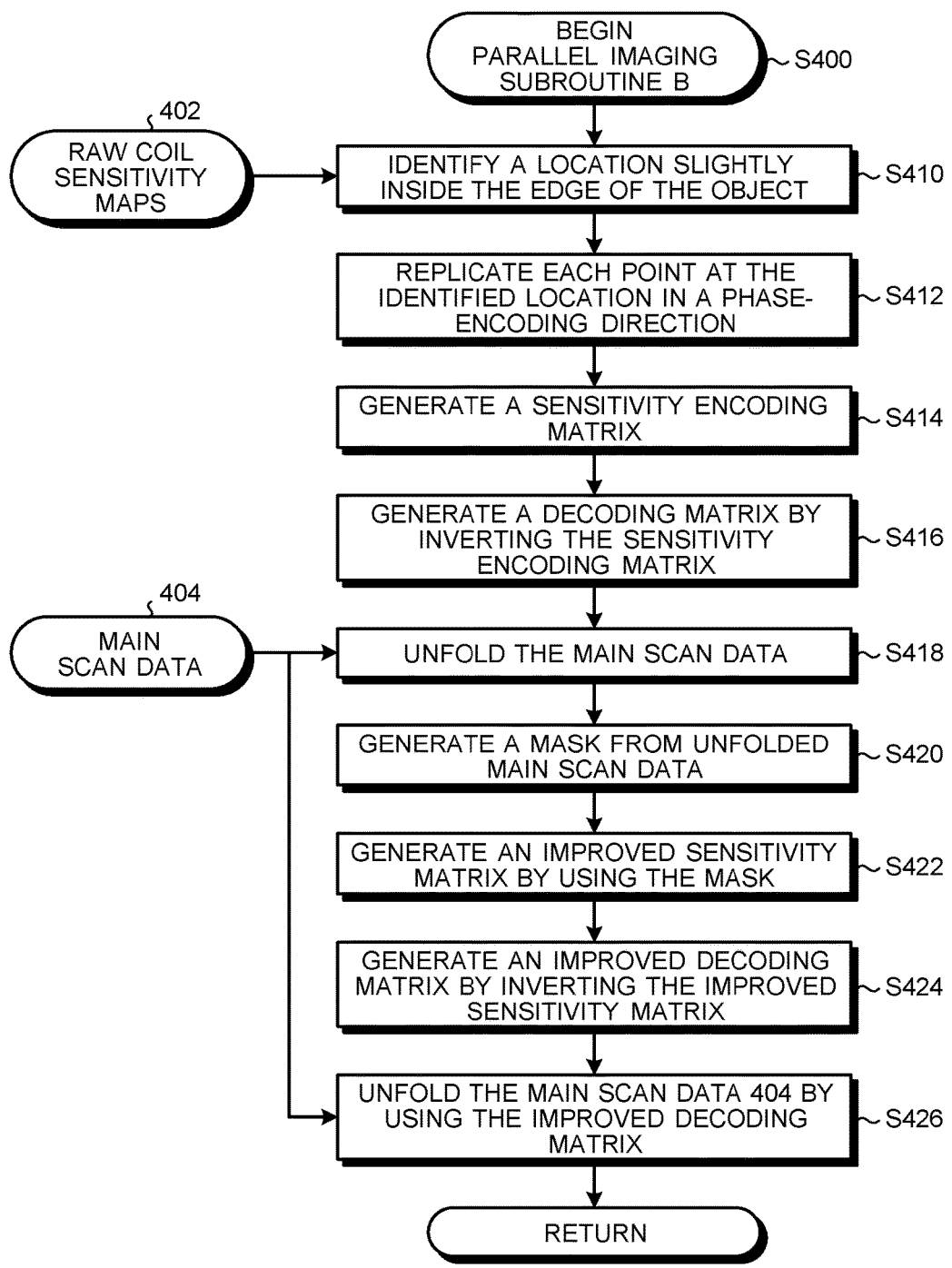
FIG. 4 illustrates a flow chart of a method to process main scan data using improved sensitivity maps and using improved masks, in accordance with one or more embodiments.

FIG. 4 illustrates a flow chart of a method to process main scans using a combination of improved sensitivity maps and improved masks, in accordance with one or more embodiments. In the illustrated embodiment, Parallel imaging subroutine B includes steps S410 to S426. In some embodiments, however, one or more of steps S410 to S426 may not be performed, or may be performed in an order other than that shown. According to an embodiment, steps S410 to S426 are performed in the processing of step S308 discussed above.

The MRI system begins Parallel imaging subroutine B (step S400). The MRI system controller 22 identifies a location slightly inside the edge (such as the rim) of the object (step S410). Coil sensitivity maps, such as coil sensitivity maps generated at step S304 discussed above, are processed to determine the edges (e.g., rim) of the object being scanned. The input coil sensitivity maps 402 are referred to herein as "raw coil sensitivity maps" to reflect that these maps have not yet been extended. However, some embodiments may use coil sensitivity maps upon which some further processing may have already been performed.

The processing at step S410 may include the use of a conventional edge finding technique to detect the edge of the object being scanned, using a 2D representation of the object (e.g., a cross-sectional slice image). Having identified the edge, a set of points slightly inside the edge is determined.

The exact amount of distance to the edge from the set of selected points is configurable. For example, the selected points may be a configurable number of pixels inside of the edge, or a configurable distance measurement (e.g., millimeters, centimeters, etc.) inside from the edge, or within a configurable distance range (e.g., 0.5-1.5 cm). According to another embodiment, not all points in the set of selected points are at the same distance from the edge. Some points may be located at different distances from the edge, for example, because it is determined that an initially designated selected point may not have a value that represents that actual coil sensitivity with sufficient accuracy. For example, if the initially designated location for a point (according to the configured distance range) is very close to bone or an air pocket, then the initially designated location may be changed so that it is still within the configured distance range but further from the bone or air pocket that may have caused inaccurate sensitivity values in the immediately surrounding region.

The MRI system controller 22 replicates each point at the identified location in a phase-encoding direction (step S412). In other words, the MRI system controller 22 corrects the sensitivity distribution in accordance with a distortion that is contained in the magnetic resonance image and that results from the performing of the main scan. The edge of the object in the coil sensitivity maps is extended. Specifically, respective points from the identified set of points from step S410 are replicated (as contrasted to a curve-fitted extrapolation) at least in the phase-encoding direction of the main scan (e.g., where most error is expected) up to some configurable distance away from the edge. According to an embodiment, the points may be replicated up to the end of the field of view (FOV) in either direction along the phase encode axis (e.g., if phase encode is a left-right direction, then the selected points from slightly inside the edge are replicated so that the edge is extended to the left and to the right).

In other words, serving as the corrector, the MRI system controller 22 determines, in accordance with the direction of the distortion contained in the magnetic resonance image, a direction in which the sensitivity distribution is enhanced or reduced and corrects the sensitivity distribution. Specifically, the MRI system controller 33 corrects the sensitivity distribution by enhancing or reducing the sensitivity distribution using a replication. More specifically, the MRI controller 22 replicates, for the replication, a point inside the edge corresponding to the object in the sensitivity distribution in a phase-encoding direction. The distortion is a distortion that occurs along the phase-encoding direction in a k-space and that appears in the magnetic resonance image.

Figure 5A:
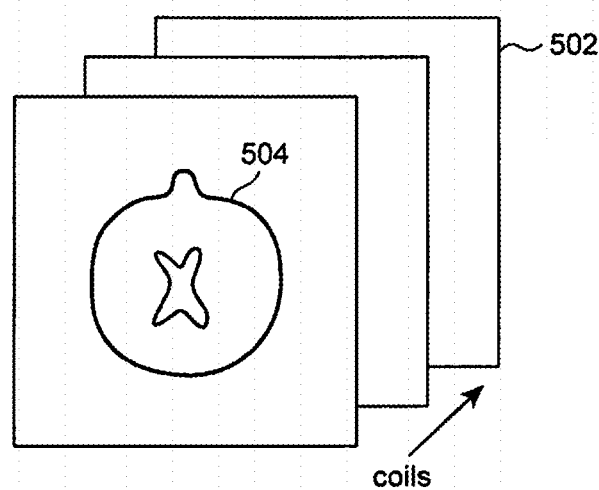
FIGS. 5A, 5B and 5C show sketch diagrams illustrating extending of sensitivity maps, in accordance with one or more embodiments.
Figure 5B:
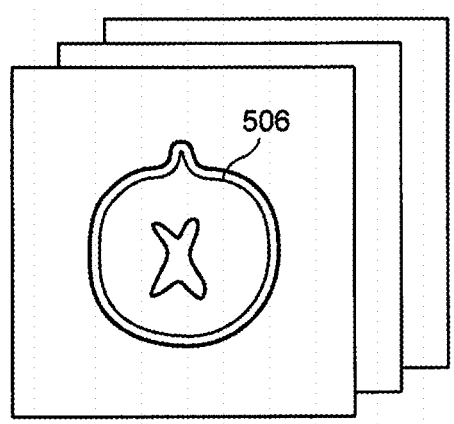
Figure 5C:
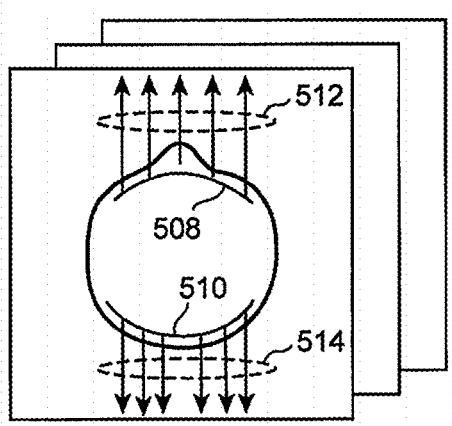

An example of an exemplary replication is illustrated in FIGS. 5A-C. FIGS. 5A-C show sketch diagrams illustrating extending of sensitivity maps, in accordance with one or more embodiments. Raw or uncorrected sensitivity maps 502 (e.g., sensitivity maps as acquired by the respective coils) are accessed in a memory or storage of the MRI system. Each raw sensitivity map 502 (of a 2D extension of coil sensitivity maps) is analyzed to identify an exterior edge 504. FIG. 5A illustrates the raw sensitivity maps 502 with identified edges 504. Next, as described in relation to step S410 above, a set of points at a location 506 is identified (e.g., by locating an approximate edge and rim inside the object like a rim relatively near to the identified edge) slightly inside of the edge, as shown in FIG. 5B. According to an embodiment, in a head scan, points that are 1 cm inside of the edge can be selected. Next, as shown in FIG. 5C and discussed above in relation to step S412, at least some points 508 and 510 from the selected set of points at the location 506 are extended in the direction 512 and 514 of likely misregistration. For example, the data is extended in the direction of phase encoding in EPI or the direction of likely misregistration. As shown in this embodiment, the direction of likely misregistration is the direction of phase encoding associated with the main scan (which need not correspond to the phase encode direction of the sensitivity map prescan). The extensions 512 and 514 of the points are achieved by replicating points 508 and 510. As noted above, the extension of the points by replication in this embodiment is in contrast to conventional techniques which typically have extended sensitivity maps by extrapolating via curve-fitting to spatial polynomials for respective coils. Moreover, the preferred extension of points 508 and 510 in the phase-encoding direction in this embodiment is, again, in contrast to conventional techniques which extend the edges in various (e.g., perhaps all) directions in accordance with curve-fitting to polynomials for the respective coils.

Figure 7:
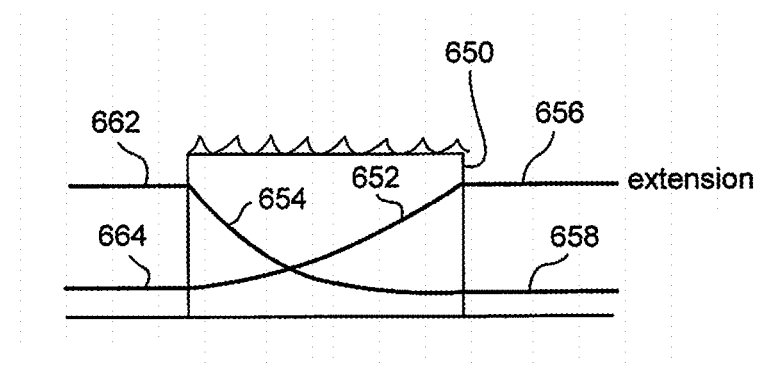
FIG. 7 illustrates a technique for extending sensitivity maps, in accordance with one or more embodiments.

FIG. 6A illustrates example conventional techniques for extending sensitivity maps. FIG. 6B illustrates example errors that can be caused by extending sensitivity maps according to conventional methods. For example, coil extrapolation of an object in the phase encoding direction may involve measuring coil sensitivities 604,606 for coils 1, 2. A fit to the interior measured sensitivities is made and then extrapolated to exterior locations 610, 612. FIG. 7 illustrates a technique for extending sensitivity maps, in accordance with one or more embodiments. A conventional technique of extending the edge of the scanned object by extrapolation is graphically illustrated in FIG. 6A. FIG. 6B illustrates an example of an error source with EPI that can be caused by such conventional techniques for extending sensitivity maps. The extending of sensitivity maps by replication, according to exemplary embodiments, is illustrated in FIG. 7. In FIGS. 6A-B and 7, the physical phase encode direction is assumed to be along the horizontal (left-right) direction. The vertical direction in these small sketches can be thought of as a signal intensity axis.

FIG. 6A graphically illustrates the extension of coil sensitivity values in accordance with conventional techniques. An edge 602 of the scanned object is determined. Generally, areas within the detected edge are considered to have reliable measured coil sensitivity values. Thus, based upon the point values inside of the detected edge, curve-fitted polynomials are determined for respective coil sensitizes from the array. Considering an example array of 2 coils, polynomials 604 and 606 representing coil sensitivities respectively for coil 1 and coil 2 of the array are determined so as to fit corresponding point values within the area enclosed by the detected edge. The polynomials 604 and 606 may be determined, for example, by any one of several known polynomial fitting techniques. Having determined the polynomials for the respective coils for the interior of the object being scanned, conventional techniques then extrapolate each of the polynomials 604 and 606 into regions 610 and 612 outside of the detected edge. Some extrapolation techniques are described, for example, in King et al., U.S. Pat. No. 6,836,116 and Ballester et al., U.S. Pat. No. 6,949,928. Note that it is common that true coil sensitivity patterns without misregistration or distortion can rise very quickly outside of the object, because it is common for the coil array conductors to be located close to the object, and small distances between a signal location and a coil conductor element yield high sensitivities, according to the Biot-Savart law.

FIG. 6B graphically illustrates how, when conventional extension techniques are applied, a spatially misregistered signal such as that generated in EPI can lead to significant errors. Coil sensitivity values 632 and 634, (and EPI signal levels associated with images weighted by those same sensitivities) which are within the detected edge 620 of an object, may be referred to as being defined at a true or correct signal location. Values 626 and 628 representing the coil sensitivities (or the sensitivity-weighted main image (EPI) pixel signal values) but at a misregistered signal location, may appear nearby to the respective correct values 632 and 634. When the actual coil sensitivities are then extended based upon extrapolating corresponding polynomials, relatively large errors may occur. For example, the magnitude of misregistration-induced error between misregistered signal 628 and corresponding true signal 634 inside the edge 620 of the scanned object, as shown by 640 which indicates the difference between unfolded position 638 and corresponding misregistration position 634, gets substantially larger when reconstructing images.

With further reference to FIG. 6B, coil sensitivity values 634 and 632 are used to encode the corresponding signal. However, the corresponding coil sensitivities used during reconstruction unfolding are coil sensitivity values 638 and 636, respectively. These coil sensitivity values outside the detected edge 620 of the object are determined based upon the polynomials that fit the coil sensitivity values for respective coils. As graphically shown, the error 640 between 638, which is the coil sensitivity used during reconstruction, and coil sensitivity 634 which actually encodes the signal, appears to be substantially larger than the corresponding actual error caused by the particular misregistration of the signal. One of the reasons for the relatively large error between 634 and 638 is the extrapolation of data from inside the detected edge to outside in accordance with curve-fitted polynomials specific to the coil sensitivities of each coil.

FIG. 7 graphically illustrates extending (replication) of points (e.g., coil sensitivity values) from inside the detected edge 650 to the outside, by replicating to the extended areas corresponding values from inside the detected edge, in accordance with an embodiment. This provides an improved extension of the sensitivity map outside of the mail object based on the practical observation that distortions or misphased signals are more often originating near an edge, not from a deep interior region. Accordingly, the sensitivity map for coil 1 would include sensitivities 654 in the area inside the detected edge and sensitivities 658 and 662 in the extended areas. Likewise, the sensitivity map for coil 2 would include sensitivities 652 in the area inside the detected edge and sensitivities 656 and 664 in the extended areas.

Returning now to FIG. 4, the MRI system controller 22 generates a sensitivity encoding matrix (also referred to as a sensitivity matrix) (step S414). A technique such as that disclosed in Pruessmann or the '116 patent can be used to determine the sensitivity encoding matrix. The sensitivity encoding matrix can be, for example, an N×C matrix, wherein each row i, i=1 . . . N represents a coil i of the phased array coil, and each column j, j=1 . . . C represents an aliased pixel location. Thus, the value in the matrix at location (i, j) would represent the sensitivity for the $j^{th}$ pixel as received at coil i. The values for the respective elements in the sensitivity matrix can be determined from the sensitivity maps obtained during the prescan. Thus, before the sensitivity maps are extended, as at step S412 above, the sensitivity matrix includes measured sensitivity values. After extension by replication, the sensitivity matrix may include some values based upon the extension.

The MRI system controller 22 generates a decoding matrix by inverting the sensitivity encoding matrix (step S416). The decoding matrix enables converting the data from multiple coils (specified in the sensitivity matrix) back to multiple unaliased pixels. The inversion may be in accordance with known matrix inversion techniques, such as, for example, the Moore-Penrose pseudoinverse (which happens to be a closed form solution for the least-squares solution, with minimum noise, assuming simple forms of uniform uncorrelated noise). Optionally, receiver noise levels and correlation of noise in the receiver channels can be used when determining the inverse of the sensitivity matrix, as described in Pruessmann. In exemplary embodiments herein, the inversion may or may not consider receiver noise levels and correlation. However, when the decoding matrix is determined without considering receiver noise levels, some penalty in terms of reduced SNR (signal to noise ratio) can be expected.

The MRI system controller 22 unfolds the main scan data 404 (step S418). The unfolding of the main scan data is performed using the decoding matrix generated at step S416. In some embodiments, the unfolding at step S418 is performed without using a mask. A mask indicates which ones of the data points in the images can be ignored due to being outside of a region of interest (ROI). According to another embodiment, the unfolding at step S418 includes the use of a mask formed based upon the coil sensitivity maps or coil sensitivity matrix. For example, a mask formed based upon coil sensitivity maps or coil sensitivity matrix would indicate which of the pixel locations are inside a region of interest, and which pixel locations are outside, and such information can be used to improve the quality of the unfolding process by only considering pixel locations that are inside and/or close to, the ROI. It is noted that, because the sensitivity matrix and its pseudoinverse—the decoding matrix—are not unitary, the inversion would usually amplify any noise (as quantified by the "g-value") already present in the main image. A conventional technique to lower the g-value (e.g., reduce noise) is to exclude aliased points from encoding and inversion, if it is known from the sensitivity maps that there should be no signal at a particular location. Pruessmann describes reducing the size of the sensitivity matrix based upon removing aliased points that have no signal, and that solving a smaller system of constraints allows more freedom to minimize noise. Besides totally eliminating entire lines of the encoding matrix, it is also plausible to deweight lines corresponding to pixels that should have little or no signal. U.S. Pat. No. 6,486,671 to King et al., which is hereby incorporated by reference in its entirety, describes a technique to modify the sensitivity matrix and add a regularizing term to the matrix inversion process, thereby reducing noise at the expense of some loss of signal fidelity. Conventionally, the points to exclude or de-weight are identified using the prescan sensitivity maps because they are intrinsically free of aliasing.

Techniques for unfolding main scan data (image) using a decoding matrix are known, and a technique such as that described in Pruessmann can be used to obtain an unfolded diagnostic image from the main scan data using a decoding matrix as discussed above. The unfolded diagnostic image at this stage, is referred to as an intermediate diagnostic image.

The MRI system controller 22 generates a mask from the main scan data unfolded at step S418 (the intermediate diagnostic image) (step S420). The mask can be determined based upon a thresholding function by which certain pixels or areas are identified as having less than a required pixel intensity. The required pixel intensity may be configurable. The mask is intended to indicate which ones of the data points in the images can be ignored due to being outside of a ROI. The mask enables the exclusion of a pixel from consideration in the reconstruction, when the corresponding location in the scanned object contributes no signal, e.g., because it lies outside of the object or ROI. In general, by removing pixels that are not likely to contribute to the reconstruction, the degree of aliasing is reduced, which in turn may improve the SNR. Removing pixels from the encoding matrix can be done in totality, with matrices that have lines deleted, or the removal can be done in part and without changing the size of the matrices, by deweighting lines with multiplication by a small value. If lines are deweighted and not explicitly removed, the same size matrix inversion can be done for every set of aliased pixels, and the algorithm may be more amenable to computational parallel processing. In other words, serving as a mask generator, according to the processing at steps S418 and S420, the MRI system controller 22 generates an intermediate magnetic resonance image by performing first unfolding processing on the signals obtained by parallel imaging and generates a mask or weighting information using the generated intermediate magnetic resonance image.

The MRI system controller 22 generates an improved sensitivity matrix by using the mask generated at step S420 (step S422). According to an embodiment, as described above, columns in the sensitivity matrix represent aliased pixel locations. According to an embodiment, based upon the mask, one or more columns in the sensitivity matrix which correspond to pixel locations that do not contribute a signal, or are outside of the ROI can be removed.

The MRI system controller 22 generates an improved decoding matrix by inverting the improved sensitivity matrix (step S424). The processing at step S424 may be performed in the same manner as step S416, but based upon the improved sensitivity matrix. The improved sensitivity matrix can be inverted, with or without considering receiver noise, in order to generate the decoding matrix.

The MRI system controller 22 unfolds the main scan data 404 by using the improved decoding matrix (step S426). The processing at step S426 may be performed in the same manner as step S418 was performed, based upon the improved decoding matrix. By the end of step S426, the main scan output image has been reconstructed. In other words, serving as the generator, according to the processing at steps S422 to S426, the MRI system controller 22 generates an output magnetic resonance image by performing second unfolding processing using the sensitivity distribution of each coil obtained by the prescan, the signals obtained by the parallel imaging, and the mask or the weighting information.

In this manner, serving as the generator, the MRI system controller 22 generates an output magnetic resonance image using the corrected sensitivity distribution.

Figure 8:
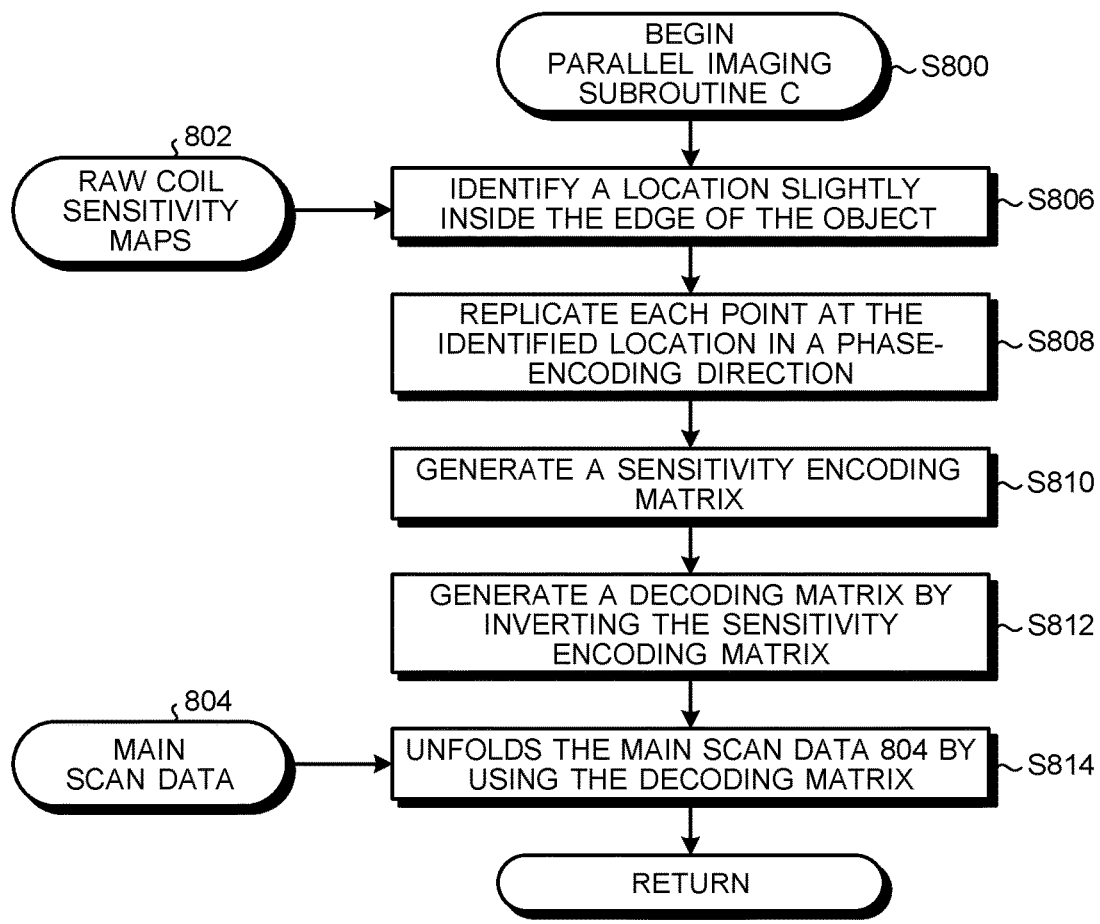
FIG. 8 illustrates a flow chart of a method to process main scan data using improved sensitivity maps, in accordance with one or more embodiments.

FIG. 8 illustrates a flow chart of a method to process main scans using improved sensitivity maps, in accordance with one or more embodiments. FIG. 8 illustrates a flow chart to process main scan data using improved sensitivity maps, in accordance with one or more embodiments. In the illustrated embodiment, Parallel imaging subroutine C includes steps S806 to S814. In some embodiments, however, one or more of steps S806 to S814 may not be performed, or may be performed in an order other than that shown. According to an embodiment, steps S806 to S814 are performed in the processing of step S308 discussed above.

In Parallel imaging subroutine C, diagnostic images may be generated using the improved sensitivity maps disclosed herein, but without requiring that the improved mask disclosed herein be used.

The MRI system begins Parallel imaging subroutine C (step S800). Raw sensitivity maps 802, which may be sensitivity maps obtained from the receiver coils and which are not aliased, are provided as input to step S806. Steps S806 to S812 may be performed in a manner similar to corresponding steps S410 to S416 as discussed above. Optionally, at step S810, in addition to the processing discussed in relation to step S414, a mask generated based upon the sensitivity maps or sensitivity matrix may be considered when the sensitivity encoding matrix is generated. The use of a mask in creating the decoding matrix is discussed above in relation to other steps.

The MRI system controller 22 unfolds the main scan data 804 by using the decoding matrix generated at step S812 (step S814). As discussed above, the main scan data 804 may be an aliased image.

Figure 9:
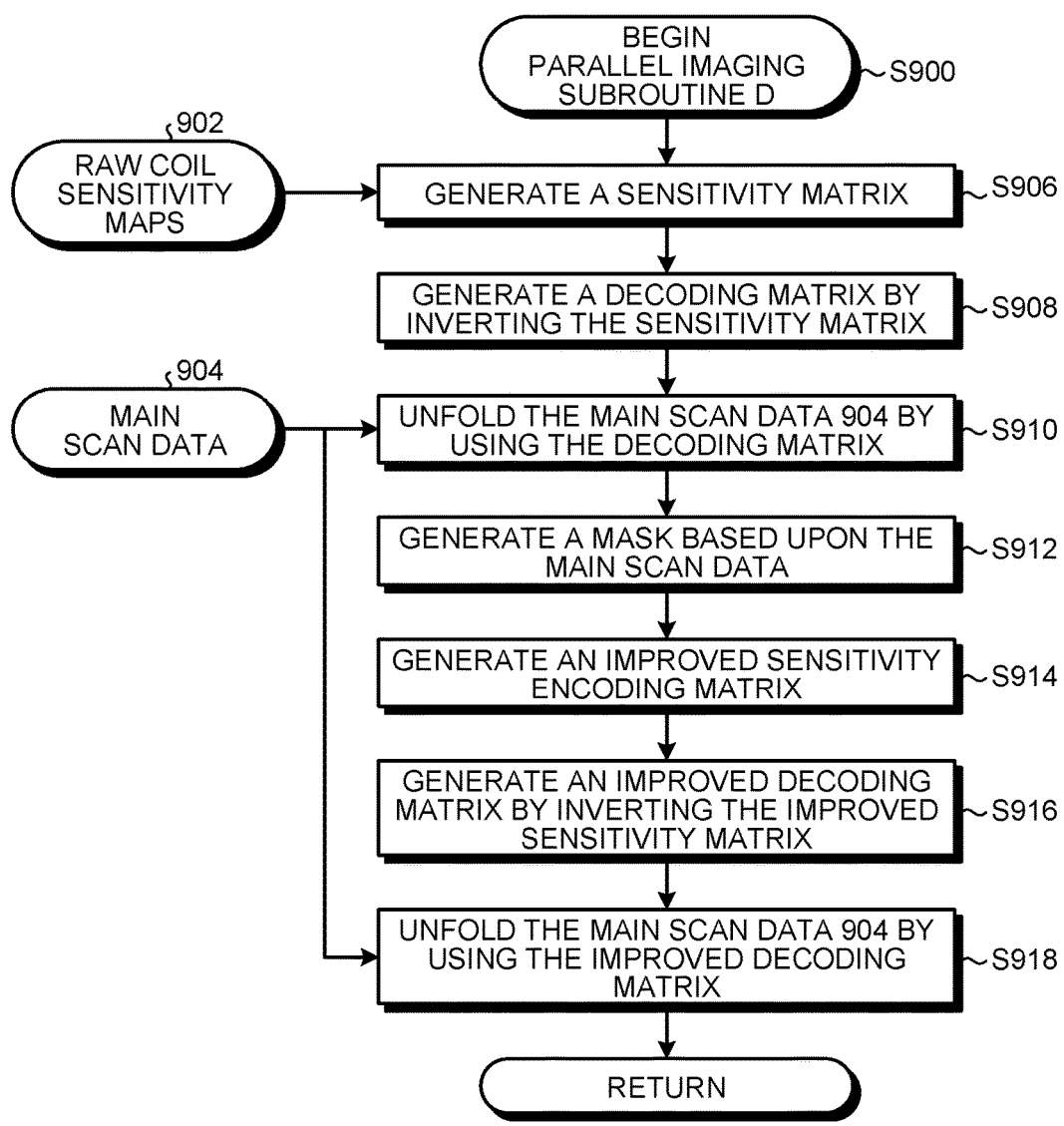
FIG. 9 illustrates a flow chart of a method to process main scan data using improved masks, in accordance with one or more embodiments.

FIG. 9 illustrates a flow chart of a method to process main scan data using improved masks, in accordance with one or more embodiments. FIG. 9 illustrates a flow chart of Parallel imaging subroutine D to process main scan data using an improved mask, in accordance with one or more embodiments. In the illustrated embodiment, Parallel imaging subroutine D includes steps S906 to S918. In some embodiments, however, one or more of steps S906 to S918 may not be performed, or may be performed in an order other than that shown. According to an embodiment, steps S906 to S918 are performed in the processing at step S308 discussed above.

Parallel imaging subroutine D may be used to generate diagnostic images using the improved mask disclosed herein, but without requiring that the improved sensitivity maps disclosed herein be used.

The MRI system begins Parallel imaging subroutine D (step S900). Raw sensitivity maps 902, which may be sensitivity maps obtained from the receiver coils and which are not aliased, are provided as input to step S906. At step S906, a sensitivity matrix is generated based upon the sensitivity maps. According to some embodiments, the sensitivity maps are used without any further processing to extend the maps beyond the object boundary. In other embodiments, the maps may be extended at step S906 to extend beyond the object edges. The extension may be based upon extrapolation of known (e.g., measured) sensitivity values. For example, the extrapolation may be in accordance with prior art techniques such as those described above in relation to FIG. 6A, but preferably using the replication extension techniques such as that described above in relation to FIG. 7.

The MRI system controller 22 generates a decoding matrix by inverting the sensitivity matrix, which is generated using the sensitivity maps (step S908). The sensitivity maps may or may not have been extended. The generation of a sensitivity matrix and a decoding matrix are discussed above.

The MRI system controller 22 unfolds the main scan data 904 by using the decoding matrix (step S910). The MRI system controller 22 generates a mask based upon the main scan data unfolded at step S910 (step S912). Unfolding and mask generation were described with FIG. 4.

Using the mask generated at step S912, the MRI system controller 22 generates an improved sensitivity encoding matrix (step S914). In a manner similar to that discussed above in relation to step S422, the improved sensitivity matrix may be generated by removing or otherwise deweighting pixel locations that either do not provide a signal or lie outside the region of interest.

The MRI system controller 22 generates an improved decoding matrix by inverting the improved sensitivity matrix generated at step S914 (step S916). The MRI system controller 22 unfolds the main scan data 904 by using the improved decoding matrix generated at step S916 (step S918).

FIG. 10 illustrates a flow chart of a method to use improved sensitivity maps and improved masks, in accordance with one or more embodiments, in combination with 2D phase correction in EPI. FIG. 10 illustrates a flow chart of a method 1000 to use improved sensitivity maps in combination with improved masks, in accordance with one or more embodiments, in combination with 2D phase correction in EPI. In the illustrated embodiment, Parallel imaging subroutine E includes steps S1022 to S1050. In some embodiments, however, one or more of steps S1022 to S1050 may not be performed, or may be performed in an order other than that shown. According to an embodiment, steps S1022 to S1050 are performed in the processing of step S308 discussed above.

Parallel imaging subroutine E combines the improved sensitivity maps and improved mask, as disclosed herein, with the use of 2D phase correction in EPI. 2D phase correction is used frequently to remove Nyquist ghosts in EPI images. Xu, D. et al., "Robust 2D Phase Correction for Echo-Planar Imaging under a Tight Field of View" Magn. Reson. Med., 2010 December; 64(6):1800-13 ("Xu") includes a description of 2D phase correction in EPI. In general, method of step S1000 illustrates the use of improved sensitivity maps and improved masks as disclosed herein with 2D Nyquist low spatial frequency ghost correction.

The MRI system begins Parallel imaging subroutine E (step S1000). The MRI system controller 22 extends coil sensitivity maps 1002 in the phase-encoding (PE) direction (step S1022). As discussed above in relation to steps S410 to S412, extending coil sensitivity maps 1002 may include locating an area on the sensitivity maps or prescan images which are slightly inside of the edge of the object, and extending identified pixels by replication in the phase encode direction. The extended sensitivity maps 1008 may be held in a memory.

At step S1024, the MRI system controller 22 takes EPI Nyquist prescan data (also known as "EPI templates") 1004 as input to generate separate even and odd reference images using 2DFT (2D Fourier transform) (step S1024). The EPI templates may have been acquired in a prescan (separate from the prescan that obtains sensitivity maps). The MRI system controller 22 uses the even and odd reference images to determine phase differences of the even-line images and the odd-line images (step S1026). The phase differences over the multiple channels are accumulated with or without additional processing. The MRI system controller 22 determines a phase by using the arctangent from the signal values of the real part and the imaginary part (ATNA) (step S1028) thus generates Nyquist correction map 1010. Nyquist correction map 1010, in some embodiments, identifies the multiplicative complex phase map needed to remove Nyquist ghosts.

The MRI system controller 22 selects a reference MRI data acquisition shot from among images of an EPI main scan 1006 (step S1030). Based upon the selected reference image, the MRI system controller 22 determines the even and odd 2DFT image data for mask generation (step S1032).

The MRI system controller 22 takes the even and odd 2DFT image data determined at step S1032, Nyquist correction map 1010, and extended sensitivity maps 1008 as input to generate intermediate EPI images 1036 (step S1034). The processing at step S1034 may include encoding of a sensitivity matrix, inverting the sensitivity matrix to generate the decoding matrix, and then using the decoding matrix to unfold the EPI images. The EPI images 1036 are, however, suboptimal in the sense that they may have high g-values.

Based upon the suboptimal EPI images 1036, the MRI system controller 22 identifies pixel locations whose intensity values are less than a threshold (thresholding) (step S1038). The threshold may be configured or dynamically determined. A non-contrast map may be generated where these locations are weighted in a manner that the respective locations have decreasing weight as they spread out from the scanned object. The pixels locations identified as below a threshold are then used to determine a mask or deweight map 1012. The non-contrast map is an example of weighing information representing a luminance value that is weighted according to the pixel position.

The MRI system controller 22 determines even and odd 2DFT for all EPI main scan images 1006 (step S1040). Then, at step S1042, the MRI system controller 22 considers the even and odd 2DFT image data from each of the EPI main scan images 1006 together with the mask 1012, Nyquist map 1010, and extended sensitivity maps 1008, to generate final EPI images 1050 which have lowered g-values as desired (step S1042). Similar to the processing at step S1034, the processing at step S1042 includes encoding a sensitivity matrix, generating a decoding matrix, and unfolding the EPI images using the decoding matrix.

Subsequently, the final EPI images can be subjected to various post processing functions, such as, for example, PKH (Partial k-space homodyne filtering correction), IUC (radio frequency Image Uniformity Correction), GDC (Gradient distortion correction), and the like. The final diagnostic images (output images) are obtained from the final EPI images or post processed final EPI images.

As will be appreciated, the above embodiments provide improved parallel MR imaging by using either or both of: (a) an unfolded "intermediate" diagnostic image to create a more accurate mask for use in further processing raw image data for final unfolded diagnostic images; and/or (b) an extension of coil sensitivity maps by replication (rather than curve-fitted extrapolation) for use in final unfolding of diagnostic images.

Application to Case Other than Parallel Imaging

The case has been described where the MRI system performs imaging by parallel imaging, but embodiments are not limited to this. For example, the above-described enhanced sensitivity maps (sensitivity distributions) may be used for luminance correction.

Specifically, conventionally, luminance correction is performed using a sensitivity map acquired by a prescan (e.g. reference scan) in order to obtain an output magnetic resonance image (output image). However, for example, when a main scan is performed by EPI, because the obtained image is distorted as shown in FIG. 2A, proper luminance correction cannot be performed even by using the sensitivity distribution obtained by the prescan, which may lower the quality of the output image.

Thus, the MRI system according to the embodiment performs a luminance correction using the sensitivity map (e.g. FIG. 7) on the image obtained by EPI. Accordingly, the MRI system performs the luminance correction using the extended coil sensitivity distribution on the distorted image so that the luminance correction can be performed properly, which can improve the quality of the output image.

Application to Case Other than EPI

The case has been described above where the MRI system performs imaging using EPI, but embodiments are not limited to this. For example, the above-described problem can occur in, in addition to EPI, a case where a pulse sequence where the polarity of the gradient magnetic field is inverted is implemented. For this reason, the MRI system according to the embodiment may be applied to, in addition to the EPI, a case where a pulse sequence where the polarity of a gradient magnetic field is inverted is implemented.

Also, as those in the art will appreciate, it is possible to not generate or use a mask if instead a "regularization" process is used.

According to at least one of the above-described embodiments, the image quality of the output image can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:
   MRI system components including a static field magnet and a gradient magnetic field coil, a radio frequency (RF) coil, RF transmitter and receiver circuits and at least one programmed computer connected to control said MRI system components so as to
   perform a prescan acquiring signals from said RF coil which provide a sensitivity distribution of said RF coil;
   perform a main scan acquiring signals from said RF coil which provides a magnetic resonance image;
   correct the sensitivity distribution in accordance with a distortion contained in the magnetic resonance image and that results from performing the main scan; and
   generate an output magnetic resonance image, using the corrected sensitivity distribution.

2. The magnetic resonance imaging apparatus according to claim 1, wherein the distortion is a distortion that occurs along a phase-encoding direction in a k-space and that appears in the magnetic resonance image.

3. The magnetic resonance imaging apparatus according to claim 1, wherein the sensitivity distribution is corrected by enhancing or reducing the sensitivity distribution in a direction determined in accordance with a direction of the distortion contained in the magnetic resonance image.

4. The magnetic resonance imaging apparatus according to claim 1, wherein the sensitivity distribution is corrected by enhancing or reducing the sensitivity distribution using replication.

5. The magnetic resonance imaging apparatus according to claim 4, wherein, for the replication, a point inside an edge corresponding to an object in the sensitivity distribution in a phase-encoding direction is replicated.

6. The magnetic resonance imaging apparatus according to claim 1, wherein
   for the prescan, sensitivity distributions of a plurality of RF coils are acquired, respectively,
   parallel imaging is performed as the main scan,
   an intermediate magnetic resonance image is generated by performing first unfolding processing on signals obtained by the parallel imaging and a mask or weighting information is generated using the generated intermediate magnetic resonance image, and
   the output magnetic resonance image is generated by performing second unfolding processing using the sensitivity distribution of each RF coil obtained by the prescan, the signals obtained by the parallel imaging, and the mask or the weighting information.

7. The magnetic resonance imaging apparatus according to claim 1, wherein EPI (Echo Planar Imaging) is performed as the main scan.

8. A magnetic resonance imaging (MRI) apparatus comprising:
   MRI system components including a static field magnet and a gradient magnetic field coil, a plurality of radio frequency (RF) coils, RF transmitter and receiver circuits and at least one programmed computer connected to control said MRI system components so as to
   perform a prescan acquiring sensitivity distributions of the plurality of radio frequency (RF) coils, respectively;
   perform parallel imaging as a main scan for acquiring signals of a magnetic resonance image;
   generate an intermediate magnetic resonance image by performing first unfolding processing on signals obtained by the parallel imaging and generate a mask or weighting information using the generated intermediate magnetic resonance image; and
   generate an output magnetic resonance image by performing second unfolding processing using (a) the sensitivity distributions of the respective RF coils obtained by the prescan, (b) the signals obtained by the parallel imaging, and (c) the mask or the weighting information.

* * * * *